United States Patent [19]

Carl, Jr. et al.

[11] Patent Number: 4,502,025
[45] Date of Patent: Feb. 26, 1985

[54] HIGH SPEED PIN DIODE SWITCHED ANTENNA COUPLER AND METHOD

[75] Inventors: Robert H. Carl, Jr., Rochester; Floyd Koontz, Holcomb; Daniel F. Pedtke, Fairport, all of N.Y.

[73] Assignee: Harris Corporation, Melbourne, Fla.

[21] Appl. No.: 371,247

[22] Filed: Apr. 23, 1982

[51] Int. Cl.³ .................... H03H 1/00; H03H 7/00
[52] U.S. Cl. .................. 333/24 R; 333/17 M; 334/56; 455/120; 307/360; 307/262
[58] Field of Search .......... 333/17 M, 24 R, 177, 333/185; 334/56, 71, 38; 336/195; 455/120, 125

[56] References Cited

U.S. PATENT DOCUMENTS

| | | | |
|---|---|---|---|
| 2,545,544 | 3/1951 | Doherty | 336/195 X |
| 3,197,723 | 7/1965 | Dortort | 336/195 |
| 3,265,997 | 8/1966 | Olson | 334/71 X |
| 3,906,405 | 9/1975 | Kommrusch | 333/17 M |

Primary Examiner—Paul Gensler
Attorney, Agent, or Firm—L. Lawton Rogers, III

[57] ABSTRACT

A high speed antenna coupler and method for rapidly switching binary weighted values of inductance and capacitance into and out of the circuit between an antenna and a utilization circuit without unacceptably degrading the coupler or slowing the switching action. PIN diodes are utilized as switches and the control wires for the PIN diodes are disposed interiorly of the copper tubing which forms the inductance elements. The control wire for a particular inductor is withdrawn from the interior of that inductor adjacent the mid-point thereof so that the control wire will be at the same RF potential as the inductor being controlled. Two diodes are utilized for each inductor, one connected to each end thereof, so that only half of the normal reverse bias is required for switching purposes. Where a transformer is utilized to couple the antenna to the utilization circuit, the control wires may be disposed interiorly of the copper tubing which forms the winding of the transformer. A novel high voltage drive circuit is also disclosed.

14 Claims, 5 Drawing Figures

HIGH SPEED PIN DIODE SWITCHED ANTENNA COUPLER AND METHOD

RIGHTS OF THE UNITED STATES

The Government has rights in this invention pursuant to contract F30602-80-C-0324 awarded by the Department of Defense.

BACKGROUND OF THE INVENTION

The present invention relates to an antenna coupler for switching digitally weighted values of inductance and or capacitance into and out of the circuit between an antenna and a utilization circuit such as a radio transmitter. More particularly, the present invention is related to an antenna coupler in which the switching is accomplished by the application of an electrical potential to control the bias of one or more diodes associated with the element being switched.

Antenna couplers are well known in which inductive and capacitive elements are selectively switched into and out of the circuit. Vacuum relays are typically used but are generally unsatisfactory as a result of their slow switching speed and operating life.

The use of PIN diodes as switching elements is also well known. For example, diodes are used in the operation of a transmit/receive or T/R switch which selectively couples the antenna to either a transmitter or receiver.

However, isolation is generally a problem in the use of PIN diodes for switching RF circuit elements in that the RF energy present in the antenna circuit would otherwise destructively overload the drive circuits for the PIN diodes. While inductors have been used for isolation purposes, the use of such inductors in close physical proximity to the antenna generally results in an unacceptable degradation of the antenna coupler.

It is accordingly an object of the present invention to provide a novel antenna coupler and method using PIN diodes as the switching elements.

Another object of the present invention is to provide a novel antenna coupler and method in which inductive isolation for the driver circuits for the switches does not unacceptably degrade the antenna coupler.

Still another object of the present invention is to provide a novel switchable inductive element and method of forming.

Yet another object of the present invention is to provide a novel autotransformer and method of forming.

These and many other objects and advantages of the present invention will be readily apparent to one skilled in the RF antenna art from the claims and from the following detailed description when read in conjunction with the appended drawings.

THE DRAWINGS

DETAILED DESCRIPTION

Figure 1:
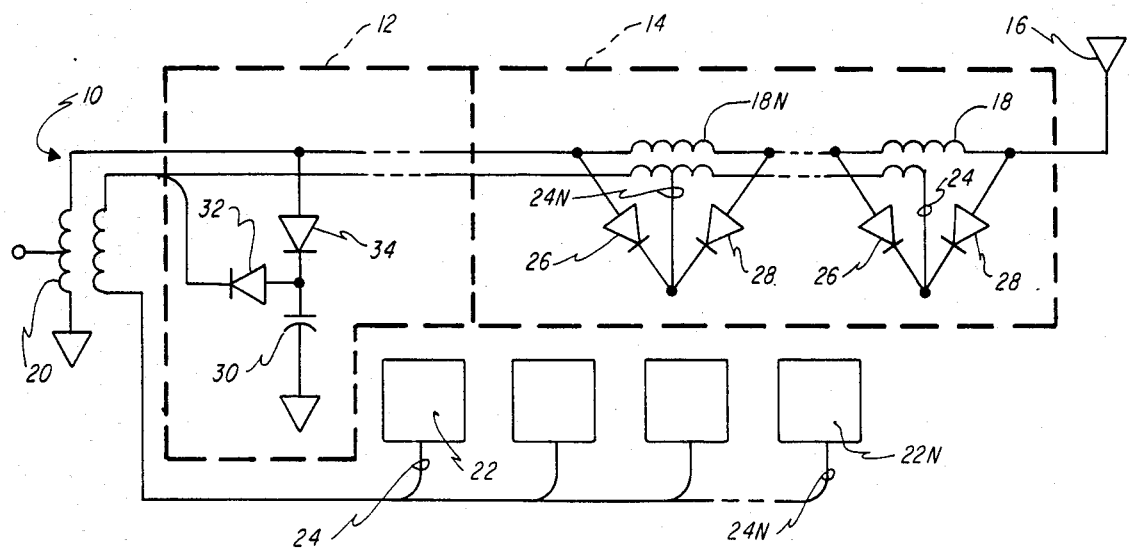
FIG. 1 is a schematic circuit diagram illustrating one embodiment of the antenna coupler of the present invention.
Figure 5:
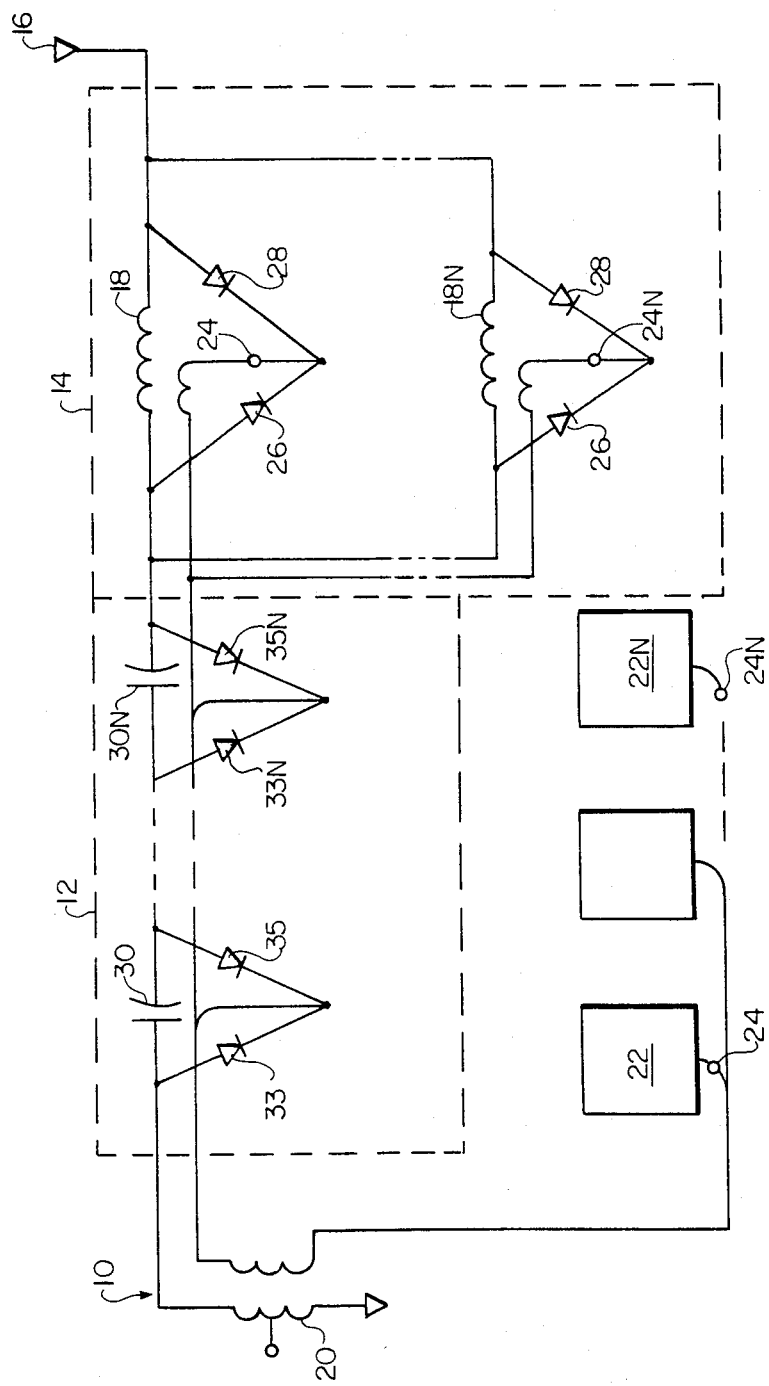

With reference to the circuit of FIG. 1, the coupler of the present invention desirably includes an autotransformer 10, a capacitor element section 12 and an inductive element section 14 in series connection with a suitable conventional antenna 16. In the embodiment illustrated in FIG. 1, the inductors 18-18N are in series with the antenna and the capacitors 30-30N (only one shown) are connected in parallel between the RF line and ground potential. However, it must be recognized that the inductors may be connected in a shunt configuration and the capacitors in series with the antenna as illustrated in the embodiment of FIG. 5 as a function of the antenna design and its intended use.

In the operation of the circuit illustrated in FIG. 1, the signal received by, or applied to, the antenna 16 is coupled through the series connected inductors 18 through 18N and across the parallel connected capacitors 30-30N (only one of which is shown) to the autotransformer 10.

Desirably, the inductors 18-18N are digitally weighted so that the selective switching thereof into and out of the circuit can produce any desired value of inductance in the coupler circuit between the antenna and the utilization circuit.

Figure 4:
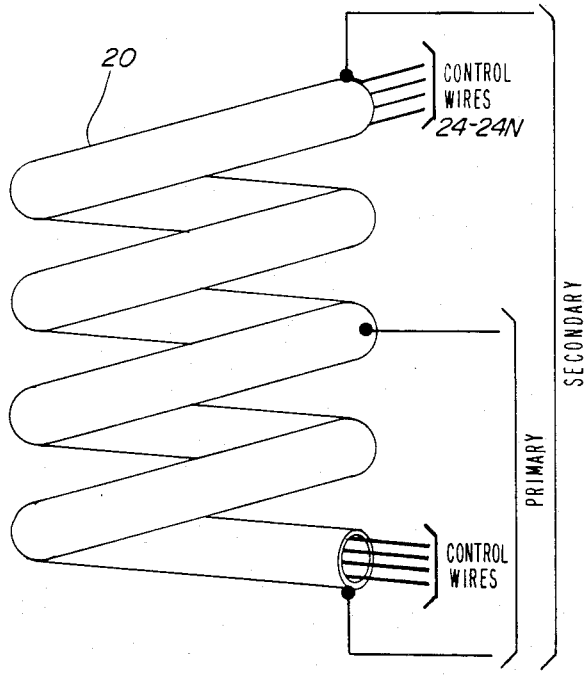
FIG. 4 is a pictorial representative of one embodiment of the autotransformer of the present invention and FIG. 5 is a schematic circuit diagram illustrating a second embodiment of the present invention.

With continued reference to FIG. 1, the control of the switching of the capacitors 30-30N and the inductors 18-18N into and out of the coupler circuit may be selectively controlled by the generation of suitable control signals in a plurality of PIN diode driver circuits 22-22N subsequently described in greater detail in connection with FIG. 3. Each of the PIN diode driver circuits 22-22N provides a high voltage binary output signal on one of the control wires 24-24N. These control wires 24-24N may be passed as a single multiple wire cable, or as individual wires, through the axial passageway within the winding of the autotransformer 10. The winding 20 of the autotransformer 10 is desirably comprised of copper tubing having sufficient internal diameter to accommodate the electrically insulated control wires 24-24N (the FIG. 4).

With continued reference to FIG. 1, the control wires 24-24N are passed through the series connected inductors 18-18N. It is desirable that the inductors 18-18N each comprise electrically conductive hollow tubing, preferably copper, having an internal diameter sufficient to accommodate the desired number of control wires 24-24N. Each of the conductors 18-18N may be apertured adjacent the approximate mid-point along the length thereof so that the control wire for that inductor may be withdrawn from the approximate center or mid-point thereof.

As shown in FIG. 1, the control wire 24N is withdrawn from an aperture in the conductor 18N. Thus, the number of control wires entering the conductor 18N will be N, and the number of control wires exiting the end of the conductor 18N will be N-1. This process is repeated until the last control wire 24 is withdrawn from an aperture at the approximate mid-point of the inductor 18.

With continued reference to FIG. 1, a pair of PIN diodes 26 and 28 are shown with the anode thereof connected one each to one end of each of the inductors 18-18N and with the cathodes thereof interconnected and connected to one of the control wire 24-24N.

In operation, the presence of a positive electrical potential on one of the control wires will operate to reverse bias both of the PIN diodes 26 and 28 associated with one of the inductors 18-18N. With the diodes 26 and 28 biased out of conduction, no shunt for that particular inductor is provided and the inductor remains in the coupler circuit. With the presence of a negative signal on one of the control wires 24-24N, the diodes 26 and 28 associated with that particular inductor will be forward biased and will conduct to effectively remove the inductor from the coupling circuit by providing a low impedance shunt therefor.

By the weighting of the inductance value of the inductors 18-18N, and the selective control thereof by the driver circuits 22-22N, the desired value of inductance may be inserted between the antenna 16 and the utilization circuit connected to the autotransformer 10.

Similarly, some of the driver circuits 22-22N may be utilized to control the switching of capacitors into and out of the coupler circuit. With continued reference to FIG. 1, the capacitance section 12 is illustrated as including a capacitor 30 and a pair of diodes 32 and 34. The anode of the diode 34 is connected to the transformer 10 end of the inductor 18N and the cathode thereof is connected to the anode of the second diode 32 and to one plate of the capacitor 30. The application of a positive electrical potential to the cathode of the diode 32 will effect the reverse bias thereof which will in turn reverse bias the diode 34 and effectively open the circuit between the capacitor 30 and the line between the autotransformer 10 and the inductor 18N.

Figure 2:
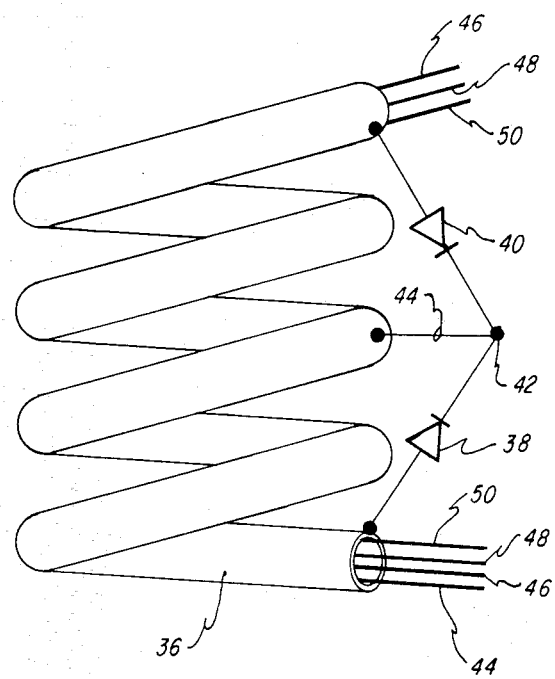
FIG. 2 is a pictorial representation of one embodiment of one of the inductors of the present invention.

With reference now to FIG. 2, where one embodiment of the inductor of the present invention is illustrated, the inductor comprises a length of hollow copper tubing formed into a coil. The lead from the anode of a pair of diodes 38 and 40 may be soldered or otherwise connected in any suitable conventional fashion to the coil 36. The cathodes of the diodes 38 and 40 are interconnected at a point 42 to which one of the control wires 44 is connected.

As shown in FIG. 2, four control wires 44-50 enter the lefthand or autotransformer end of the coil 36 and three control wires 46-50 exit the righthand or antenna end thereof, control wire 44 having been withdrawn from the mid-point of the coil 36 to control the biasing of the diodes 38 and 40. In this way, the number of control wires passing through successive ones of the inductors in series is reduced for each successive inductor in the series.

Figure 3:
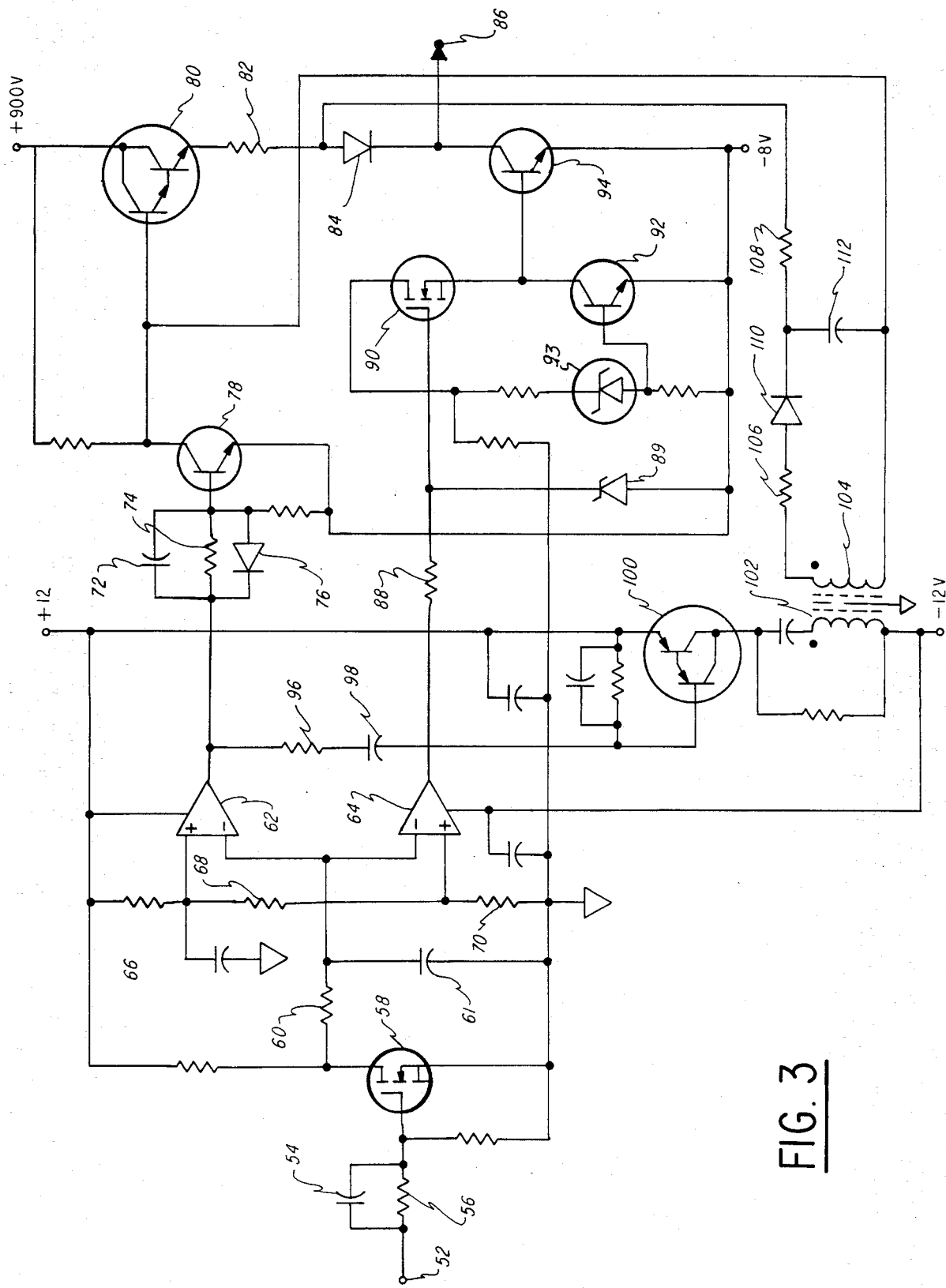
FIG. 3 is a schematic circuit diagram of one of the PIN diode driver circuits illustrated in FIG. 1.

With reference to FIG. 3 where one embodiment of a suitable driver circuit for the PIN diodes is illustrated, a selectively generated input signal representative of the desired value of coupler inductance is applied to the input terminal 52 of the circuit. Such signal as passed through the parallel combination of a coupling capacitor 54 and resistor 56 to the control electrode of a electronic valve 58 which serves as a buffer amplifier.

The output from the valve 58 is passed through a low pass filter comprising a resistor 60 and a capacitor 61 to the negative input terminals of a pair of operational amplifiers 62 and 64. The positive input terminals of the operational amplifiers 62 and 64 are connected to different points on a voltage divider network comprising series connected resistors 66, 68 and 70. As connected, the operational amplifiers serve as comparators with a common input signal but different reference voltages.

The output signal from the operational amplifier 62 is applied through the parallel combination of a capacitor 72, resistor 74 and diode 76 to the base electrode of a NPN transistor 78. The capacitor 72 permits the rapid application of a input signal, the resistor 74 limits the value, and the diode 76 facilitates rapid turn-off of the transistor 78. The overall function of the circuit is thus one of accelerating the response of the transistor 78 to an input signal.

The output signal from the operational amplifier 62 is taken from the output terminal and is applied to the control electrode of a solid state switch 80 through which a positive voltage may be applied through a current limiting resistor 82 and a diode 84 to the output terminal 86.

With continued reference to FIG. 3, the output signal from the operational amplifier 62 is also coupled through a resistor 96 and a capacitor 98 to the control terminal of a solid state switch 100 which applies a signal through the primary winding 102 of a transformer. The secondary winding 104 of the transformer is connected through a filter network comprising a pair of resistors 106 and 108, a diode 110 and a capacitor 112 across the base to emitter electrodes of the solid state switch 80. The transformer and filter network as above described functions as a pulse transformer and serves to aid the transistor 78 in insuring the cut-off of the switch 80.

With continued reference to FIG. 3, the output signal from the operational amplifier 64 is applied through a resistor 88 and across a Zener diode 89 to the control electrode of a solid state switch 90 connected in series with a NPN transistor 92. A Zener diode 93 is provided as a voltage reference to insure that the transistor 90 and 92 are not conducting at the same time. The conduction of the transistors 90 and 92 controls the conduction of the transistor 94, the collector electrode of which is connected to the output terminal 86.

In the condition where the PIN diodes are reverse biased by a positive output signal on the output terminal 86, the operational amplifier 62 provides a negative output signal which drives the NPN transistor 78 into cut-off and the switch 80 into saturation to apply the positive 900 volt source across the current limiting resistor 82 and the diode 84 to the output terminal 86.

The application of the operational amplifier 62 output signal to the pulse transformer has no effect on the circuit as a result of the diode 110.

After a delay determined by the reference voltages, i.e., approximately four microseconds after the operational amplifier 62 provides its negative output signal, the operational amplifier 64 also provides a negative output signal to drive the switch 90 into cut-off and the transistor 92 into saturation. The transistor 94 is thus driven into cut-off to eliminate any influence of the negative 8 volt source on the output signal on the terminal 86.

To forward bias the PIN diodes, operational amplifier 62 provides a positive output signal which drives the NPN transistor into saturation and the switch 80 into cut-off to remove the positive 900 volt source from the output terminal 86.

The application of the positive output signal from the operational amplifier 62 also drives the switch 100 into cut-off to provide a voltage spike to the switch 80 to insure the nonconduction thereof.

The application of the positive output signal from the operational amplifier 62 drives the switch 90 into saturation and the transistor 92 into cut-off. The transistor 94 is thus driven into saturation to apply the negative 8 volt source to the output terminal 86.

While preferred embodiments of the present invention have been described, it is to be understood that the embodiments described are illustrative only and that the scope of the invention is to be defined solely by the appended claims when accorded a full range of equivalents, many variations and modifications naturally occurring to those skilled in the art from a perusal hereof.

What is claimed is:

1. A high speed antenna coupler for electrically coupling an antenna to a utilization circuit comprising:
   a plurality of inductors each having an axial passageway and wound to a predetermined value of inductance, each of said inductors being apertured adjacent the mid-length thereof;
   a plurality of PIN diodes each having an anode connected to one end of one of said plurality of inductors, the cathodes of the two diodes connected to each of said inductors being interconnected,
   a driver circuit for each of said plurality of inductors;
   a plurality of control wires each connected between one of said plurality of driver circuits and one of said interconnections,
   each of said control wires passing through the axial passageway of those of said plurality of inductors intermediate the one of said plurality of driver circuits and the one of said plurality of inductors to which connected, and each passing through the aperture in the one of said plurality of inductors to which connected; and
   means for selectively operating said plurality of driver circuits to thereby selectively switch said plurality of inductors into and out of the circuit between an antenna and a utilization circuit by the biasing of the two diodes associated therewith.

2. The coupler of claim 1 wherein said inductors are uninsulated metallic tubing and wherein said control wires are electrically insulated conductors.

3. The coupler of claim 2 wherein said plurality of inductors are series connected; and
   including a plurality of capacitors each having first and second diodes associated therewith,
   the anode of said first diode being connected to one end of the one of said plurality of inductors furthest from the antenna,
   the cathode of said first diode being connected to the anode of said second diode and to one side of said capacitor, and
   the cathode of said second diode being connected by one of said control wires to one of said plurality of driver circuits whereby said driver circuit may selectively couple said capacitor into and out of the circuit between said series connected inductors and the utilization circuit.

4. The coupler of claim 3 including a transformer for coupling the antenna to the utilization circuit;
   wherein one winding transformer has an axial passageway; and
   wherein said plurality of control wires pass through the axial passageway in said winding.

5. The coupler of claim 4 wherein each of said plurality of driver circuits includes:
   means for providing first and second temporally spaced signals in response to an instruction signal;
   an output terminal;
   a source of positive potential;
   a second source of negative potential; and
   switch means responsive to said first and second signals for alternatively (a) disconnecting said first source from said output terminal and for thereafter connnecting said second source to said output terminal and (b) disconnecting said second source from said output terminal and for thereafter connecting said first source to said output terminal.

6. The coupler of claim 1 wherein said inductors are connected in parallel; and
   including a plurality of series connected capacitors,
   two PIN diodes for each of said capacitors, said diodes having an anode connected to opposite sides of the associated one of said capacitors and interconnected cathodes connected by one of said control wires to one of said driver circuits so that said driver circuits may selectively couple said capacitor into and out of the coupler by the biasing thereof.

7. The coupler of claim 1 including a transformer for coupling the antenna to the utilization circuit;
   wherein a winding of said transformer has an axial passageway; and
   wherein said plurality of control wires pass through said axial passageway.

8. The coupler of claim 7 wherein said transformer is an autotransformer having a single tapped winding of metallic tubing.

9. The coupler of claim 1 wherein each of said plurality of driver circuits includes:
   means for providing first and second temporally spaced signals in response to an instruction signal;
   an output terminal;
   a source of positive potential;
   a second source of negative potential; and
   switch means responsive to said first and second signals for alternatively (a) disconnecting said first source from said output terminal and for thereafter connnecting said second source to said output terminal and (b) disconnecting said second source from said output terminal and for thereafter connecting said first source to said output terminal.

10. In a method of rapidly switching impedance elements into and out of the circuit between an antenna and a utilization device by the application of digital control signals from a driver circuit to one or more PIN diodes associated therewith without unacceptable degrading of the circuit or slowing the switching action, the improvement comprising the step of passing a bias control signal for the PIN diodes coaxially through tubular inductive impedance elements intermediate the driver circuit and the element being switched.

11. In a method of rapidly switching impedance elements into and out of the circuit between an antenna and a utilization device by the application of digital control signals from a driver circuit to one or more PIN diodes associated therewith without unacceptable degrading of the circuit or slowing the switching action, the improvement comprising the step of passing a bias control signal for the PIN diodes coaxially through any inductive impedance elements intermediate the driver circuit and the element being switched,
   wherein the impedance element being switched is a tubular inductor, and wherein the PIN diodes associated therewith are two in number each connected to one end of the inductor and to each other; and
   including the further step of applying the bias controlling signal to the interconnection of the two diodes.

12. The improvement of claim 11 wherein the control signal is applied to the interconnection of the two diodes from the approximate mid-point of the inductor.

13. The improvement of claim 11 wherein the antenna is coupled to a utilization circuit through an autotransformer, and
   including the further step of passing the bias controlling signals coaxially through the inductor of the autotransformer.

14. A method of fabricating an inductor for an antenna coupler comprising the steps of:

(a) providing a length of electrically conductive tubing having an aperature adjacent the mid-point thereof;
(b) passing a plurality of electrically insulated conductors axially through the tubing and withdrawing one of the conductors through the aperture;
(c) forming the tubing into an inductor coil without removing the conductors;
(d) electrically connecting two diodes to each other and to opposite ends of the inductor; and
(e) electrically connecting the withdrawn conductor to the interconnection of the diodes.

* * * * *